United States Patent
Wirth et al.

(10) Patent No.: US 11,798,833 B2
(45) Date of Patent: Oct. 24, 2023

(54) METHODS OF USE OF A SERVO CONTROL SYSTEM

(71) Applicant: APPLIED MATERIALS, INC., Santa Clara, CA (US)

(72) Inventors: Paul Wirth, Kalispell, MT (US); Behzad Taheri, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 734 days.

(21) Appl. No.: 16/801,622

(22) Filed: Feb. 26, 2020

(65) Prior Publication Data

US 2021/0265194 A1 Aug. 26, 2021

(51) Int. Cl.
| | |
|---|---|
| *H01L 21/687* | (2006.01) |
| *F15B 9/03* | (2006.01) |
| *F15B 11/076* | (2006.01) |
| *F15B 9/14* | (2006.01) |

(52) U.S. Cl.
CPC .......... *H01L 21/68742* (2013.01); *F15B 9/03* (2013.01); *F15B 9/14* (2013.01); *F15B 11/076* (2013.01)

(58) Field of Classification Search
CPC ......... H01L 21/68742; F15B 9/03; F15B 9/14
See application file for complete search history.

(56) References Cited

U.S. PATENT DOCUMENTS

| | | | |
|---|---|---|---|
| 4,878,417 A | 11/1989 | Facon | |
| 5,458,047 A | 10/1995 | McCormick | |
| 5,612,850 A | 2/1997 | Birang et al. | |
| 5,684,669 A | 11/1997 | Collins et al. | |
| 5,790,365 A | 8/1998 | Shel | |
| 5,838,528 A | 11/1998 | Os et al. | |
| 6,646,857 B2 | 11/2003 | Anderson et al. | |
| 8,840,754 B2 | 9/2014 | Hao | |
| 2010/0208409 A1* | 8/2010 | Bluck | H01L 21/683 361/234 |
| 2013/0330154 A1 | 12/2013 | Sowden et al. | |
| 2017/0032997 A1 | 2/2017 | Willwerth et al. | |
| 2019/0030714 A1 | 1/2019 | Knopf et al. | |

FOREIGN PATENT DOCUMENTS

| | | |
|---|---|---|
| KR | 10-0448377 B1 | 9/2004 |
| KR | 10-2013-0067051 A | 6/2013 |
| WO | 94-22776 A1 | 10/1994 |
| WO | 01/31205 | 5/2001 |

OTHER PUBLICATIONS

International Search Report and Written Opinion dated Jun. 15, 2021, on application No. PCT/US2021/19736, 10 pages.

* cited by examiner

*Primary Examiner* — Scott Bauer

(74) *Attorney, Agent, or Firm* — Lowenstein Sandler LLP

(57) ABSTRACT

Disclosed herein are embodiments of a lift apparatus and systems containing a support and at least one lift apparatus for moving a substrate between the support and a transfer plane, using a servo-control system. Further disclosed herein are methods for servo control of a lift apparatus and lifting a substrate off of a support or lowering the substrate onto the support.

14 Claims, 8 Drawing Sheets

METHODS OF USE OF A SERVO CONTROL SYSTEM

FIELD

The disclosure relates generally to the field of robotics and systems and methods for servo control of a lift apparatus.

BACKGROUND

Semiconductor substrates are commonly processed in vacuum processing systems. These systems include one or more chambers, each performing substrate processing operations such as etching, chemical vapor deposition or physical vapor deposition, which can include heating or cooling of the substrate, and a plasma to assist the process. Typically, the environment within such processing chambers is maintained at a low subatmospheric pressure. Each chamber includes inlets and outlets for evacuation apparatus and the admission of processing gases, as well as an aperture controlled by a slit valve to admit substrates. Such processing chambers may be in communication with a substrate transfer chamber, and the substrate transfer chamber may have a valve-controlled aperture through which substrates can be admitted from outside the system.

The transfer of a substrate to and from a chamber and to and from the outside of the system is generally performed mechanically by a robot arm at the end of which is a substrate retaining component (e.g., a blade or end effector). To facilitate sliding the blade end of the robot arm under the substrate, one or more lift pins lift the substrate about 20 mm to 50 mm above the tool (e.g., a chuck assembly). The lift pins can be pneumatic actuated. This is accomplished using full-stroke actuation with solenoid valves such that the lift pins have two positions: up and down. There may be a 30 mm to 40 mm distance between the up and down positions of the lift pins. To transfer the substrate to the end effector of the robot arm, the lift pins are extended to the up position (e.g., 20 mm to 40 mm), the end effector is positioned below the substrate, and the lift pins are lowered to the down position, transferring the substrate to the end effector in the process. The robot arm can then remove the substrate from the process chamber. However, this transfer process is inefficient because the substrate is extended well above the end effector, then well below the end effector, which takes time to complete.

Operating the lift pins with a full-stroke actuation also can cause damage to the substrate, particularly when the substrate is removed from a support such as an electrostatic chuck. After completion of process steps, the pneumatic lift mechanism raises the lift pins to raise the substrate above the support so that the substrate can be removed from the chamber by the robot arm. When the support is an electrostatic chuck, before the lift pins can raise the substrate, the substrate must be "dechucked," that is, the electrostatic force retaining the substrate on the chuck must be removed. Conventionally, the chucking voltage supply is turned off and the chuck electrode and substrate are both connected to ground to remove the respective charges that accumulated on the chuck electrode and substrate during application of the chucking voltage to the chuck electrode. However, this conventional dechucking method may not succeed in removing all of the electrostatic attractive force between the substrate and the chuck before the lift pins attempt to lift the substrate from the chuck, and the substrate can stick to the chuck. Upon actuation of the lift pins, the substrate can crack or break and/or pop off the chuck into a position from which it is difficult to retrieve and align properly by a substrate transfer robot. In some instances, the robot arm collides with the misaligned substrate causing further damage to the robot arm. Substrate sticking can occur even when the support is not an electrostatic chuck, for example, when the support is a pedestal having a build-up of sputter material causing adherence of the substrate. All of these problems can lead to process downtime and capital costs for repairing the apparatus.

BRIEF SUMMARY

According to embodiments, described herein is a lift apparatus for transferring a substrate between a support and a transfer plane, the lift apparatus comprising: a lift pin assembly, comprising: a lift pin configured to move the substrate between the support and the transfer plane; at least one pneumatic actuator comprising a moving member configured to provide a load to the lift pin; at least one proportional pneumatic valve configured to control fluid flow between the at least one pneumatic actuator and a pressurized fluid supply or a vent; a plurality of pressure sensors each configured to independently measure pressure in a respective supply line to the at least one pneumatic actuator; and at least one position sensor configured to measure a position of the member; and a servo-control system in communication with the lift pin assembly.

According to embodiments, further described herein is a method, comprising: receiving by a controller a first pressure measurement from a first pressure sensor that measures pressure in a first chamber of a pneumatic actuator; receiving by the controller a second pressure measurement from a second pressure sensor that measures pressure in a second chamber of the pneumatic actuator; receiving by the controller a position measurement from a position sensor that measures a position of a moving member of the pneumatic actuator; generating a control signal based on the first pressure measurement, the second pressure measurement and the position measurement; transmitting the control signal to at least one proportional pneumatic valve of a servo-control system to control pressurized fluid to the pneumatic actuator; and operating the servo-control system to extend at least one lift pin and lift a substrate off of a support via the at least one lift pin.

According to various embodiments, further described herein is a method comprising: operating a servo-control system to lift a substrate off of a substrate support, wherein the servo-control system is configured to control a lift pin assembly for lifting the substrate, comprising: actuating at least one proportional pneumatic valve to permit gas to flow through a first gas line into a first chamber of a pneumatic actuator of the lift pin assembly and through a second gas line into a second chamber of the pneumatic actuator; measuring pressure in the first gas line with a first pressure sensor and measuring pressure in the second gas line with a second pressure sensor; measuring position of a moving member of the pneumatic actuator with a position sensor; controlling the at least one proportional pneumatic valve with the servo-control system to apply a contact force of about 2 N to about 10 N by the moving member to the substrate; and lifting the substrate off of the support by a lift pin operable to receive a load by the moving member.

BRIEF DESCRIPTION OF THE DRAWINGS

The present disclosure is illustrated by way of example, and not by way of limitation, in the figures of the accompanying drawings in which like references indicate similar elements.

DETAILED DESCRIPTION

Figure 1:
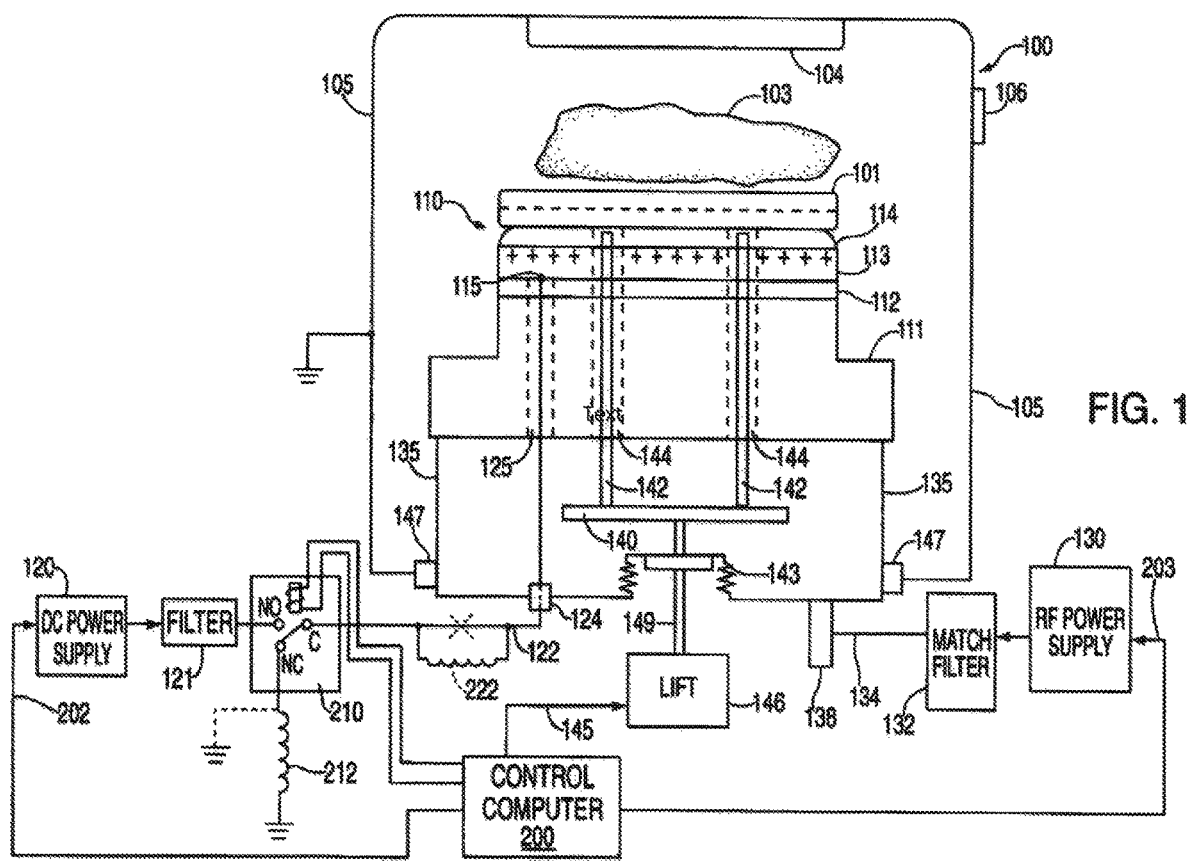
FIG. 1 depicts a processing chamber that includes a lift pin assembly.

Reference throughout this specification to, for example, "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

As used herein, the singular forms "a," "an," and "the" include plural references unless the context clearly indicates otherwise. Thus, for example, reference to "a lift pin" includes a single lift pin as well as more than one lift pin.

As used herein, the term "about" in connection with a measured quantity, refers to the normal variations in that measured quantity as expected by one of ordinary skill in the art in making the measurement and exercising a level of care commensurate with the objective of measurement and the precision of the measuring equipment. In certain embodiments, the term "about" includes the recited number±10%, such that "about 10" would include from 9 to 11.

The term "at least about" in connection with a measured quantity refers to the normal variations in the measured quantity, as expected by one of ordinary skill in the art in making the measurement and exercising a level of care commensurate with the objective of measurement and precisions of the measuring equipment and any quantities higher than that. In certain embodiments, the term "at least about" includes the recited number minus 10% and any quantity that is higher such that "at least about 10" would include 9 and anything greater than 9. This term can also be expressed as "about 10 or more." Similarly, the term "less than about" typically includes the recited number plus 10% and any quantity that is lower such that "less than about 10" would include 11 and anything less than 11. This term can also be expressed as "about 10 or less."

Unless otherwise indicated, all parts and percentages are by weight. Weight percent (wt. %), if not otherwise indicated, is based on an entire composition free of any volatiles, that is, based on dry solids content. The servo-controlled lift apparatus will be discussed in the context of a lifting mechanism for a support (e.g., a chuck, an electrostatic chuck, a pedestal, and so on). However, those of ordinary skill in the art will recognize that the servo-controlled lift apparatus can be used in systems comprising any processing chamber (e.g., a semiconductor processing chamber) that includes a lifting mechanism to transfer a substrate from the chamber to a robot arm and/or from the robot arm to the chamber.

Conventional lift mechanisms use an on/off pneumatic valve with manual restrictors to control velocity of the pneumatic cylinder (also referred to herein as a pneumatic actuator). Cylinder position is monitored only with digital end position sensors and compressed air delivery to the cylinder is switched by a solenoid driven spool valve. In the context of an electrostatic chuck assembly, energy release of a substrate is not always consistent, which can lead to substrate breakage if the pneumatic actuator force output of the lift pin is higher than the substrate strength. In some circumstances the substrate is displaced, which can result in collision of the substrate with the robot art causing substrate breakage and/or damage to the robot arm. There is no tracking or feedback of the lift pin position in these lift mechanisms making it unclear as to what caused the failure. Conventional lift mechanisms also limit throughput because the pneumatic actuator must move the lift pins slowly enough to be safe for substrate contact, but it takes 2-8 seconds for the lift pins to move.

A lift apparatus according to embodiments herein includes a position sensor that monitors the position of the pneumatic cylinder throughout the stroke. The lift apparatus further includes a proportional pressure control valve with pressure feedback from both sides of the pneumatic cylinder. This could be implemented with a single 5/2 spool valve style proportional valve or by two separate pressure control proportional valves. Each side of the pneumatic cylinder includes a pressure sensor. The proportional pressure control valve allows a varying flow and pressure to be controlled on each side of the pneumatic cylinder. Also included in the lift apparatus is a first position sensor that sends a signal to the controller regarding the position of the cylinder. Once these sensors are available, then the controller can control the force output by adjusting the delta pressure between the two sides, control the position by monitoring the position feedback, and control the stiffness by adjusting the average pressure between the two sides. The overall system stiffness is driven by the mass of gas behind each side of the cylinder.

With this control, the cylinder can be moved and stopped at intermediate positions within the full stroke length, move time can be controlled and substrate sticking to a support (e.g., a chuck assembly) can be sensed. Additionally, the lift apparatus, according to embodiments herein, enables faster lift pin motion, which can increase system throughput. The lift apparatus can also control force output, which can keep the substrate from breaking if the support (e.g., electrostatic chuck) fails to release. The lift apparatus further enables faster substrate transfer to the robot blade because the lift motion can be shortened (e.g., the total stroke of the lift is 38 mm, but it only takes 10 mm of motion to transfer the substrate to the blade). Position control of the lift pins also can be controlled, which enables a new substrate edge cleaning step to remove polymer deposition that occurs during the etch step. For example, the substrate could be lifted off a support surface by just 1 mm and could then be cleaned.

In reference to FIG. 1, during operation of a process chamber 100, a robot arm (not shown) moves a substrate 101 into the chamber 100 through a slit valve 106. The robot arm places the substrate on the tips of the lift pins 142, which are elevated by a pneumatic lift mechanism 146 above the top of the support 110 (e.g., an electrostatic chuck). The pneumatic lift mechanism 146, under control of a computer control system 162, then lowers the lift pins 142 so that the substrate is positioned onto the surface of the support. The pneumatic lift mechanism 146 may include at least one lift pin assembly comprising at least one pneumatic actuator and a servo-control system in fluid communication with the at least one pneumatic actuator, the servo-control system comprising at least one proportional pneumatic valve, a plurality of pressure sensors and at least one position sensor.

According to embodiments, a servo controlled lift apparatus system according to embodiments herein can include a support (e.g., a chuck assembly) and a lift apparatus for transferring a substrate between the support and a transfer chamber. The lift apparatus can comprise a lift pin assembly, comprising at least one pneumatic actuator, at least one proportional pneumatic valve, a plurality of pressure sensors, at least one position sensor, and a servo-control system in communication with the lift pin assembly.

Once the lift pins have lowered the substrate 101 onto the support 110, a process may begin, which can be an etch process, deposition process, cleaning process, and so on. The process may include initiating a plasma. According to certain embodiments, when the support is an electrostatic chuck, the computer control system 162 can apply a DC chucking voltage to a chuck 110 and may apply a heat transfer gas to a substrate-to-chuck interface. The chucking voltage causes negative and positive charges to accumulate on the facing surfaces of the substrate 101 and the chuck electrode 104, respectively.

The chuck 110 may include an upper dielectric (e.g., an electrostatic puck), which may support the substrate 101. After the substrate 101 is positioned onto the upper dielectric of the support 110, the lift pins 142 continue to descend into a pedestal 114. When the support 110 is an electrostatic chuck, the opposite polarity charges on the substrate 101 and chuck electrode 104 produce an electrostatic attractive force, which presses the substrate 101 against the upper face of the chuck 110. The chucking voltage is set to a value high enough to produce an electrostatic force between the substrate 101 and the chuck 110 which is adequate to prevent substrate movement during subsequent process steps within the process chamber 100. The substrate 101 thus retained securely on the chuck 110 is referred to as being "chucked."

After the substrate is placed on the support 110 (e.g., chucked), one or more process steps are performed in the chamber 100, such as deposition or etching films on the substrate 101. For processes that employ plasma, an RF power supply 130 selectively applies RF power to an antenna 112 and between a cathode pedestal 114 and a grounded anode 104, which generates a plasma 103 in the region above the substrate 101. The plasma 103 provides an electrically conductive path between the substrate and ground. However, because of the difference between the mobilities of electrons and positive ions, a DC voltage drop appears across the plasma 103 so that the substrate 101 is biased negative relative to ground. If the chucking voltage applied to the chuck electrode (the pedestal) 114 by the DC voltage supply 120 is positive, the total DC voltage between the substrate 101 and the chuck electrode 114 will be the sum of the substrate bias and the chucking voltage, thus, the substrate bias increases the electrostatic force retaining the substrate 101.

The lift assembly may include three lift pins 142 mounted on a carriage 140 that are raised and lowered by the pneumatic lift mechanism 146. After completion of the process steps, the pneumatic lift mechanism 146 raises the lift pins 142 to raise the substrate 101 above the support 110 so that the substrate 101 can be removed from the chamber 100 via the robot arm (not shown).

In embodiments where the support 110 is an electrostatic chuck, before the lift pins 142 can raise the substrate 101, the substrate 101 should be electrically dechucked, that is, the electrostatic force retaining the substrate 101 on the chuck should be removed or canceled. The chucking voltage supply is turned off, and the chuck electrode 114 and the substrate 101 are both connected to ground so as to remove the respective charges that accumulated on the chuck electrode 114 and the substrate 101 during the previous application of the chucking voltage to the chuck electrode 114. The substrate may be grounded by leaving the RF power supply 130 on at a reduced power level to maintain a plasma 103, which provides an electrically-conductive path from the substrate 101 to the grounded walls of the chamber 100. However, as discussed above, after a dechucking method is used, a residual charge often still remains on the substrate 101 and chuck 110 due to charge migration and/or field emission charging. As such, standard dechucking methods may cause undue physical force to dislodge the substrate from the chuck. In some cases, using conventional dechucking methods and conventional lift pin assemblies, the substrate cracks and/or breaks or is only partially removed. Under the latter circumstance, when the robot arm moves in to retrieve the partially removed substrate, the robot arm can crash into the substrate causing damage not only to the substrate, but to the robot arm resulting in equipment downtime. It should be noted that in embodiments where the support 110 is not an electrostatic chuck, sticking issues can still arise. For example, material deposited on the support from a sputtering process may cause sticking of the substrate to the support. The lift apparatus and control systems described herein can safely remove a substrate from any support without cracking or breaking the substrate.

Servo controlled lift apparatus systems as described herein provide the ability to sense and control force, position and stiffness of a pneumatic control valve. The systems also enable faster lift pin motion, which can increase system throughput and control of force output that can keep the substrate from breaking if a substrate sticks to the support or, for example, if an electrostatic chuck fails to release. The systems enable faster substrate transfer to the robot blade because the lift motion can be shortened and position control of the lift pins, which can enable a new substrate edge cleaning step to remove polymer deposition that occurs during the etch step.

Figure 2:
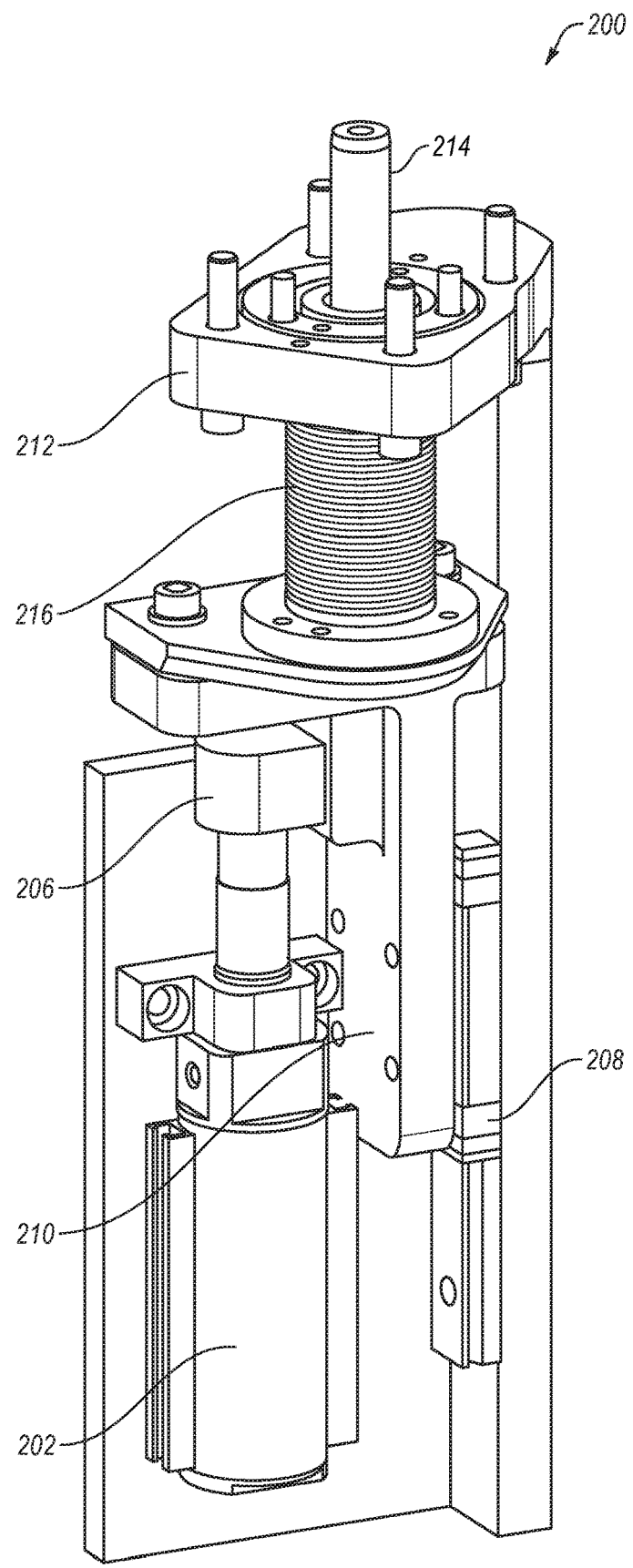
FIG. 2 depicts a lift pin assembly according to various embodiments.

A lift pin assembly 200 (for each lift pin) according to one embodiment of the present disclosure is shown in FIG. 2. The lift pin assembly 200 includes a low friction air cylinder 202 having a glass bore and a graphite seal. A sleeve 204 is positioned over a shaft of the cylinder 202 and serves as a low position hard stop for the lift pin 214. Also attached to the shaft of the cylinder 202 is a ball joint 206 that enables the lift pin assembly 200 to align with other lift pin assemblies while holding a substrate. The lift pin assembly 200 can further include a linear slide 208 along which a slide carriage 210 moves in a vertical direction. The linear slide 208 is attached to a lift assembly bracket 212. The lift pin 214 extends into the process chamber through a bellows 216, which permits vertical movement of the lift pin 214 while maintaining a vacuum in the chamber.

As discussed above, the transfer of a substrate is accomplished mechanically by means of a robot arm at the end of which is a substrate retaining component such as an end effector or robot blade. One type of retaining component is a flat blade through which a vacuum channel is formed, terminating in an outlet. The blade can pick up a substrate by touching the upper surface of the blade to the bottom surface of the substrate and optionally applying a vacuum to cause the substrate to stick to the blade. An advantage of the flat blade is that it is flat and thin and can be easily maneuvered between the tight spaces of a substrate storage cassette to pick up a substrate.

Another type of substrate retaining means has a shoe attached to the robot arm. The shoe may be a tray-like extension at the leading end of the arm, with a bevelled contour shaped to accommodate a substrate. The shoe helps to engage the substrate and retain the substrate in place upon the arm while the robot arm swings around to deliver the substrate to another location.

Figure 3:
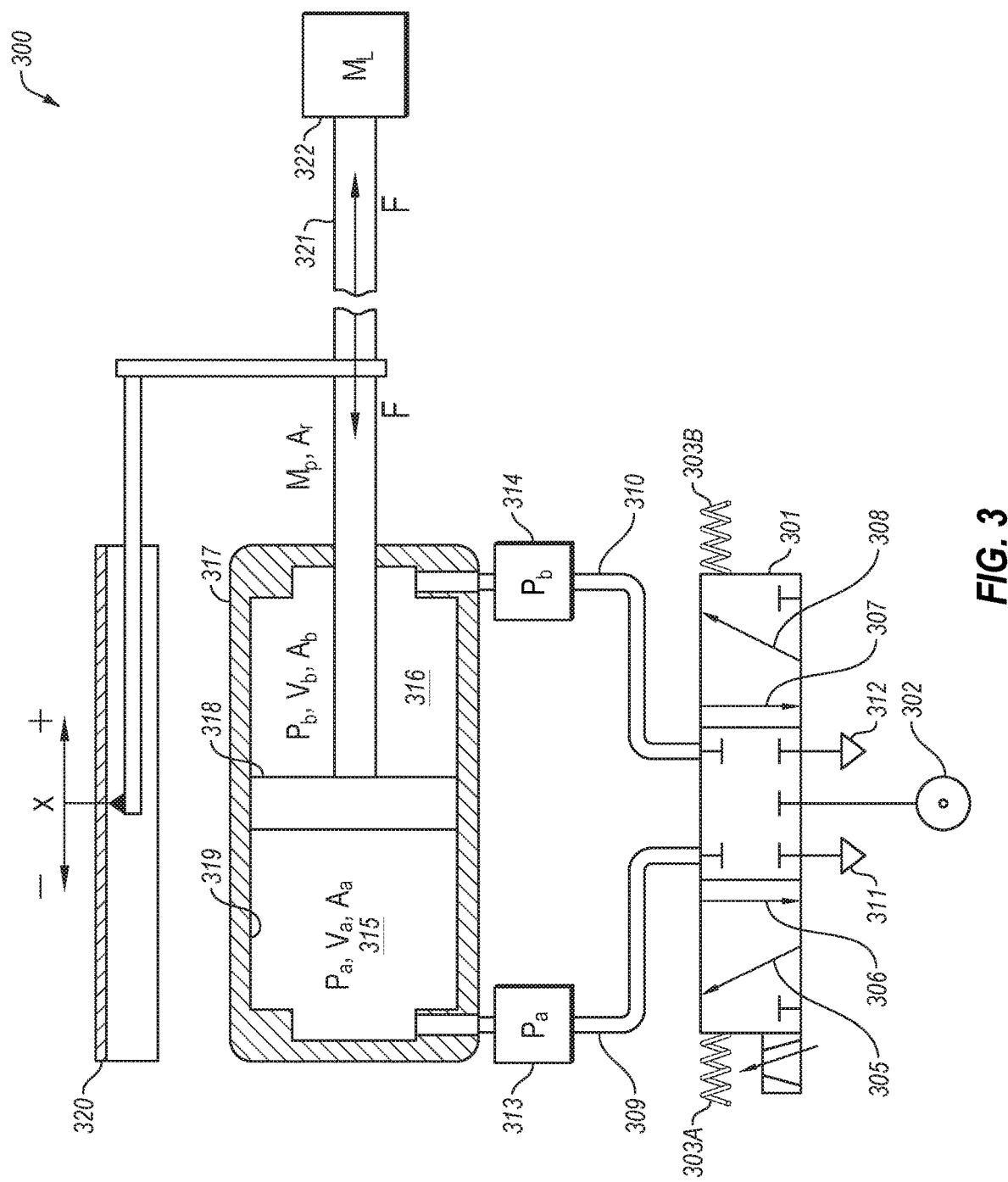
FIG. 3 depicts a lift pin according to various embodiments.

FIG. 3 shows an embodiment of a lift pin assembly 300 in accordance with the embodiments of the present disclosure. At least one lift pin assembly 300 may be a part of a lift apparatus for transferring a substrate between a support and a transfer plane (e.g., into a transfer chamber). The lift pin assembly 300 may include a four (4) way proportional pneumatic valve 301 supplied by a main source of pressurized fluid (e.g., air) 302. The proportional pneumatic valve 301 can include a pair of springs 303, 304 that enable movement of an actuator between each of four (4) flow paths 305, 306, 307, 308. Flow paths 305 and 308 permit pressurized gas to flow from the source 302 and into lines 309 and 310, respectively. Flow paths 306 and 307 permit gas to vent through lines 311 and 312, respectively.

The lift pin assembly 300 further includes pressure sensors 313, 314, which measure the gas pressure in chambers 315, 316, respectively, of a pneumatic actuator 317. Each pressure sensor may be a diaphragm type sensor with a strain gauge, e.g., a resistance wire strain gauge, and/or piezoresistive strain gauge. According to embodiments, the proportional pressure control valve can be a single 5/2 spool valve style proportional valve or by two separate pressure control proportional valves. In at least one embodiment, the pressure sensor is a proportional pressure regulator with piezo technology. Chambers 315 and 316 are defined on each side of a moving member (e.g., a piston) 318 and by the interior of a cylinder housing 319 of the pneumatic actuator 317. The proportional pneumatic valve 301 permits pressurized gas to flow into and/or to vent from chambers 315, 316. The lift pin assembly 300 may also include a position sensor 320 that determines the position of the moving member 318 within the pneumatic actuator 317. The position sensor can be a linear position sensor and/or an inductive position sensor, for example, a magneto-inductive position sensor. The moving member 318 controls the position of the lift pin 321.

During operation, the lift pin 321 has a load 322 that may be a combination of the weight of a substrate (not shown), a spring force from a bellows and/or pressure inside the process chamber. According to embodiments, the lift pin assembly 300 may also include one or more ball joint (not shown) to help align with other lift pin assemblies in the lift apparatus.

Figure 4:
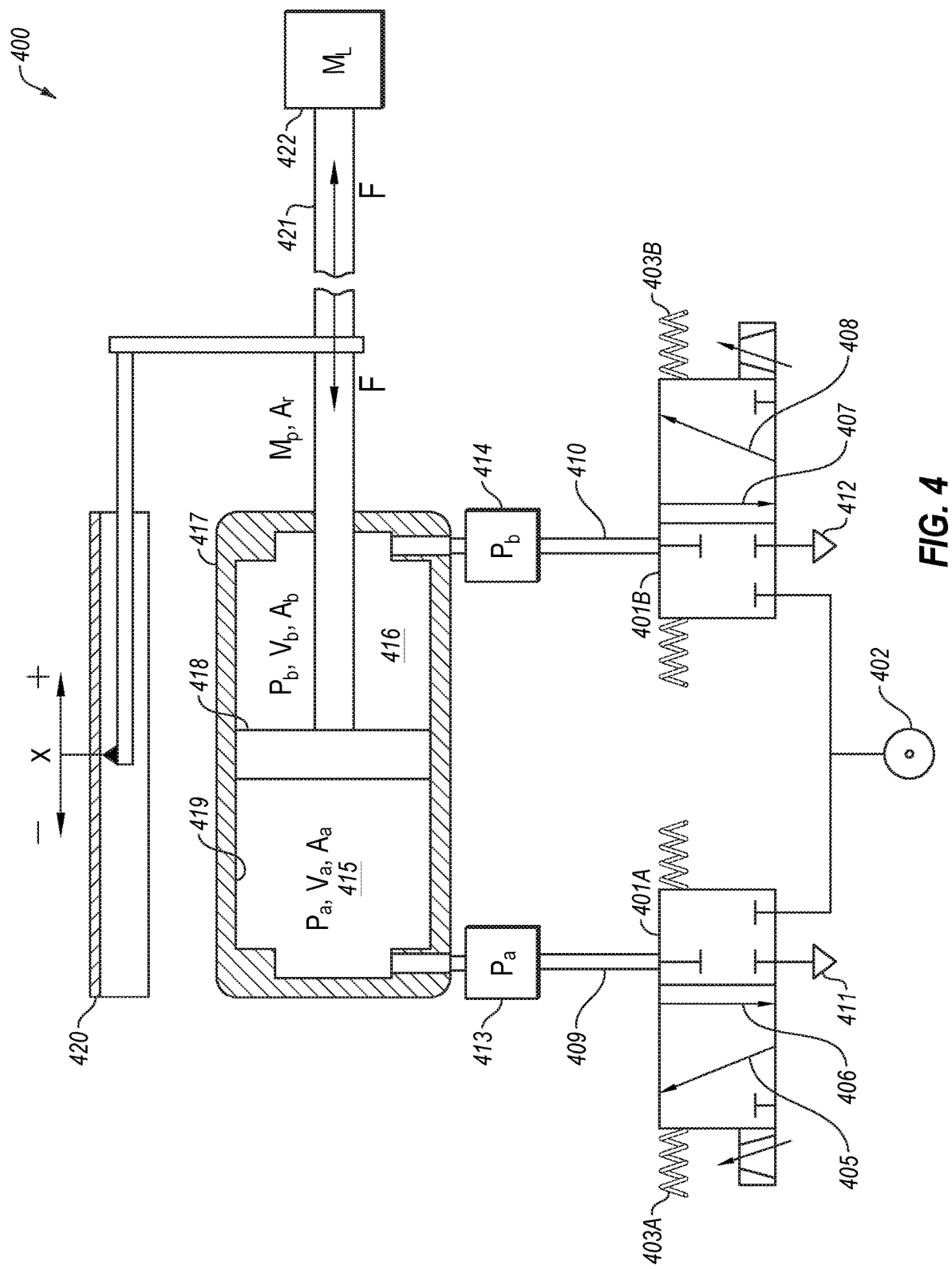
FIG. 4 depicts a lift pin according to various embodiments.

Another embodiment of a lift pin assembly 400 in accordance with the disclosure is shown in FIG. 4. At least one lift pin assembly 400 may be a part of a lift apparatus for transferring a substrate between a support and a transfer plane associated with a transfer chamber. The lift pin assembly 400 may include two 2-way proportional pneumatic valves 401A, 401B supplied by one (shown) or more main source of pressurized fluid (e.g., air) 402. Each of the pneumatic valves 401 includes a spring 403, 404 that enables movement of the actuator between each of flow path 405, 406, 407, 408. Flow paths 405 and 408 permit pressurized gas to flow from the source 402 and into lines 409 and 410, respectively. Flow paths 306 and 307 permit gas to vent through lines 411 and 412, respectively.

The lift pin assembly 400 further includes pressure sensors 413, 414, which measure the gas pressure in chambers 415, 416, respectively, of a pneumatic actuator 417. Chambers 415 and 416 are defined on each side of a moving member (e.g., a piston) 418 and by the interior of a cylinder housing 419 of the pneumatic actuator 417. The proportional pneumatic valves 401A, 401B permit pressurized gas to flow into and/or to vent from chambers 415, 416. The lift pin assembly 300 may also include a position sensor 420 that determines the position of the moving member 418 within the pneumatic actuator 417. The moving member 418 controls the position of the lift pin 421. During operation, the lift pin 421 has a load 422 that may be a combination of the weight of a substrate (not shown), a spring force from a bellows and/or pressure inside the process chamber. According to embodiments, the lift pin assembly 400 may also include one or more ball joint (not shown) to help align with other lift pin assemblies in the lift apparatus.

The above-mentioned lift assembly 300, 400 can be a part of a servo-control system. The servo control system initiates the pneumatic valve(s) 301, 401A, 401B to direct pressurized gas into chambers 315, 315, 415, 416 and/or to vent pressurized gas from these chambers. The servo control system utilizes measurements from the pressure sensors 313, 314, 413, 414 and the position sensor 320, 420 to determine the output force of the pneumatic actuator 317, 417 and the stiffness of the valves(s) 301, 401A, 401B. A controller (not shown), in addition to the lift pin assembly 300, 400, completes the servo control system. The servo-control system is configured to maintain a closed loop, wherein at least one of chamber pressure and moving member position is controlled within the pneumatic actuator. The at least one proportional pneumatic valve 301, 401A, 401B is configured to direct pressurized fluid 302, 402 through at least one of the plurality of fluid flow paths 305, 306, 307, 308 in response to a control signal from the servo-control system. The controller calculates the proper amount of pressure for each pneumatic cylinder chamber to move the lift as fast as possible while avoiding the substrate damage.

Figure 5:
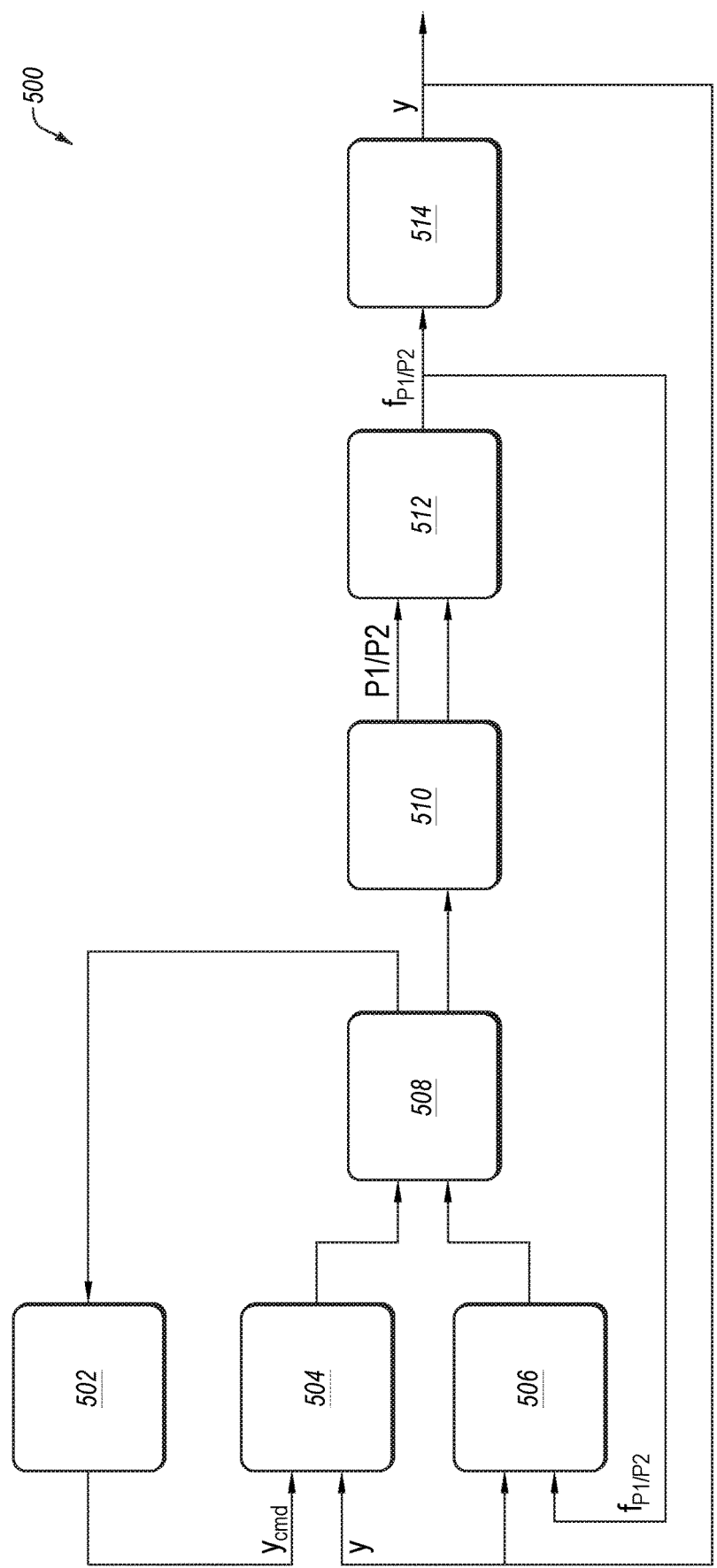
FIG. 5 depicts a servo control system according to embodiments.

FIG. 5 shows a servo control system 500 in accordance with embodiments herein. The path planner 502 generates a trajectory ($y_{cmd}$) to move a lift pin close to a substrate. The position controller 504 produces the commanded force ($f_{cmd}$) that is required to move the lift pin assembly 514 based on the generated trajectory and the received feedback (y) from the position sensor. The force estimator's 506 function is to determine if contact between the support and the substrate has occurred or not and whether the support is engaged or released. From the estimated force ($f_e$) of the force estimator 506, the force controller 508 commands the path planner 502 whether to continue the movement or to pause until the support (e.g., electrostatic chuck) is fully disengaged while keeping a small amount of force to push the substrate without breaking it. The force controller 508 receives two inputs: the commanded force ($f_{cmd}$) from the position controller 504 and the estimated force ($f_e$) from the force estimator 506. It calculates the right amount of force ($f_d$) to keep the contact force between the lift pin and the substrate below a certain limit (i.e., to prevent breaking the substrate) and to maintain the position of the lift pin close to the substrate. The pressure controller 510 calculates the commanded pressure for each chamber of the pneumatic actuator 512 based on the required force ($f_d$) that it receives from the force controller 508. The pressure controller 510 in effect produces the right amount of force to move the lift pin while preventing the substrate from breaking. The pneumatic actuator 512 produces the desired force output (f) to move the at least one lift pin or to maintain contact with the substrate depending on the amount of the chamber pressures $p_1$ and $p_2$. It should be noted that each of the position controller 504, force estimator 506, force controller 508 and pressure controller 510 may be modules of a controller of the servo-control system or each may be an individual controller.

In one embodiment, servo-control of the lift apparatus can be implemented via a control algorithm for controlling the lift apparatus. For example, a pneumatic actuator 317, 417 of the lift apparatus can include a pneumatic cylinder. See FIGS. 3 and 4. The difference between the pressures $P_a$, $P_b$ in the chambers 315, 316, 415, 416 determines the output force F and their sum governs the desired stiffness of the cylinder 318, 418. Thus, in order to control the force and stiffness of the pneumatic actuator 317, 417 one has to be able to control the pressures $P_a$, $V_a$, $A_a$ and $P_b$, $V_b$, $A_b$ of the cylinder chambers 315, 316, 415, 416 individually.

The relationship between the pressure in each chamber $P_a$, $V_a$, $A_a$ and $P_b$, $V_b$, $A_b$, the air mass flow rate $\dot{m}_a$, $\dot{m}_b$, and the piston position $\pm x$. Each chamber 315, 316, 415, 416 can be modeled as a control volume with the following assumptions: 1) the air is an ideal gas, 2) pressure and temperature within each chamber are uniformly distributed, and 3) the kinetic and potential energy of the air are negligible. Considering these assumptions and applying the conservation of mass, the ideal gas model, and the conservation of energy to each chamber, we obtain Equation (1):

$$\dot{P} = \frac{RT}{v}\dot{m} \quad (1)$$

where R is the ideal gas constant, P is the pressure, T is the absolute temperature, V is the volume, and $\dot{m}$ is the mass flow rate in or out of the cylinder chamber 315, 316, 415, 416. The volume of each chamber depends on piston position as in Equation (2):

$$V = V_0 + A\left(\frac{1}{2}L \pm x_p\right) \quad (2)$$

where $V_0$ is the inactive volume at the end of the stroke and includes the volume $V_a$, $V_b$ of the tube connecting the chamber 315, 316, 415, 416 to the pressure sensor, A is the effective piston area, L is the piston stroke, and $x_p$ is the piston position. The normalized inactive length associated with the inactive volume $V_a$, $V_b$ in each chamber 315, 316, 415, 416 of the cylinder 318, 418 can be defined as $L_{oa}=V_{oa}/A_a$, and $L_{ob}=V_{ob}/A_b$, where a and b denote the two chambers 315, 316, 415, 416 of the cylinder as shown in FIGS. 3 and 4. Therefore, the volume of each chamber as a function of the piston position will be as shown in Equation (3):

$$V_{a,b} = A_{a,b}(L_{a,b} \pm x_p), \quad L_{a,b} = L_{oa,ob} + \frac{1}{2}L \quad (3)$$

In Equations (2) and (3), the plus and minus signs correspond to chambers a and b, respectively. Combining Equations (1) and (3), the pressure equations of the chambers become $$\begin{cases} \dot{P}_a = \frac{RT}{V_a}\dot{m}_a - \frac{P_a}{L_a + x_p}\dot{x}_p \\ \dot{P}_b = \frac{RT}{V_b}\dot{m}_b + \frac{P_b}{L_b + x_p}\dot{x}_p \end{cases} \quad (4)$$

An isothermal approximation for the chamber charging/discharging process can be used with good results. Nevertheless, to compensate for the isothermal process assumption, the controller should be designed robust against parametric uncertainty. The force produced by the pneumatic cylinder is as shown in Equation (5):

$$F = P_a A_a - P_b A_b - P_{atm} A_r \quad (5)$$

where $A_r$ is the cylinder rod cross-sectional area and $P_{atm}$ is the atmospheric pressure. The stiffness of the cylinder is the rate of change of the cylinder force F with respect to the piston position x, with the mass of air inside the chambers, $m_{a,b}$, considered constant as follows in Equation (6):

$$K = -\frac{\delta F}{\delta x_p} \quad (6)$$

Using force from (5) into (6) we get Equation (7):

$$K = -A_a \frac{\partial P_a}{\delta x_p} + A_b \frac{\partial P_b}{\delta x_p} \quad (7)$$

Assuming constant temperature, the pressure in each chamber will be a function of the mass of the air inside the chamber (m) and the position of the piston ($x_p$). The time derivative of the pressure becomes Equation (8):

$$\frac{dP}{dT} = \frac{\delta P}{\delta m}\dot{m} + \frac{\delta P}{\delta x_p}\dot{x}_p \quad (8)$$

Comparing (4) and (8), the partial derivative of the pressure with respect to position is $$\begin{cases} \frac{\delta P_a}{\delta x_p} = \frac{P_a}{L_a + x_p} \\ \frac{\delta P_b}{\delta x_p} = \frac{P_b}{L_b + x_p} \end{cases} \quad (9)$$

From (7) and (9), the actuator stiffness can be written as $$K = \frac{A_a P_a}{L_a + x_p} + \frac{A_b P_b}{L_b - x_p} \quad (10)$$

The lift pin assemblies 300, 400 as described above, can be used in a process chamber as part of the servo control system to remove (e.g., dechuck) at least one substrate from a support (e.g., an electrostatic chuck assembly).

The servo controlled lift apparatus according to embodiments herein can determine the position of the at least one lift pin 321, 421 upon receiving a signal indicative of cylinder 318, 418 position (x) from the position sensor 320, 420. The position of the at least one lift pin 321, 421 also is indicative of the position of a substrate received by the at least one life pin 321, 421. For example, the position of the at least one lift pin 321, 421 coupled with the predetermined thickness of the substrate enables a precise determination of the substrate's position in the process chamber.

The servo controlled lift apparatus, according to embodiments herein, enables determination of the force F produced by the pneumatic cylinder. See Equation (5). According to embodiments, if the servo control system determines that the positive force F (e.g., when the lift pin is rising) reaches a predetermined value, for example, a relatively high output force indicative of a substrate sticking to a support, the system can slow down or reverse movement of the lift pin by reducing (e.g., at a linear rate, an exponential rate) the pressure $P_a$ in chamber 315, 415 and/or increasing pressure $P_b$ in chamber 316, 416. Practically, substrates that stick to supports can be peeled off. Servo control of the lift apparatus as described herein can slowly increase or reduce output force to prevent breaking the substrate and/or to slowly peel the substrate off the support assembly.

Figure 6:
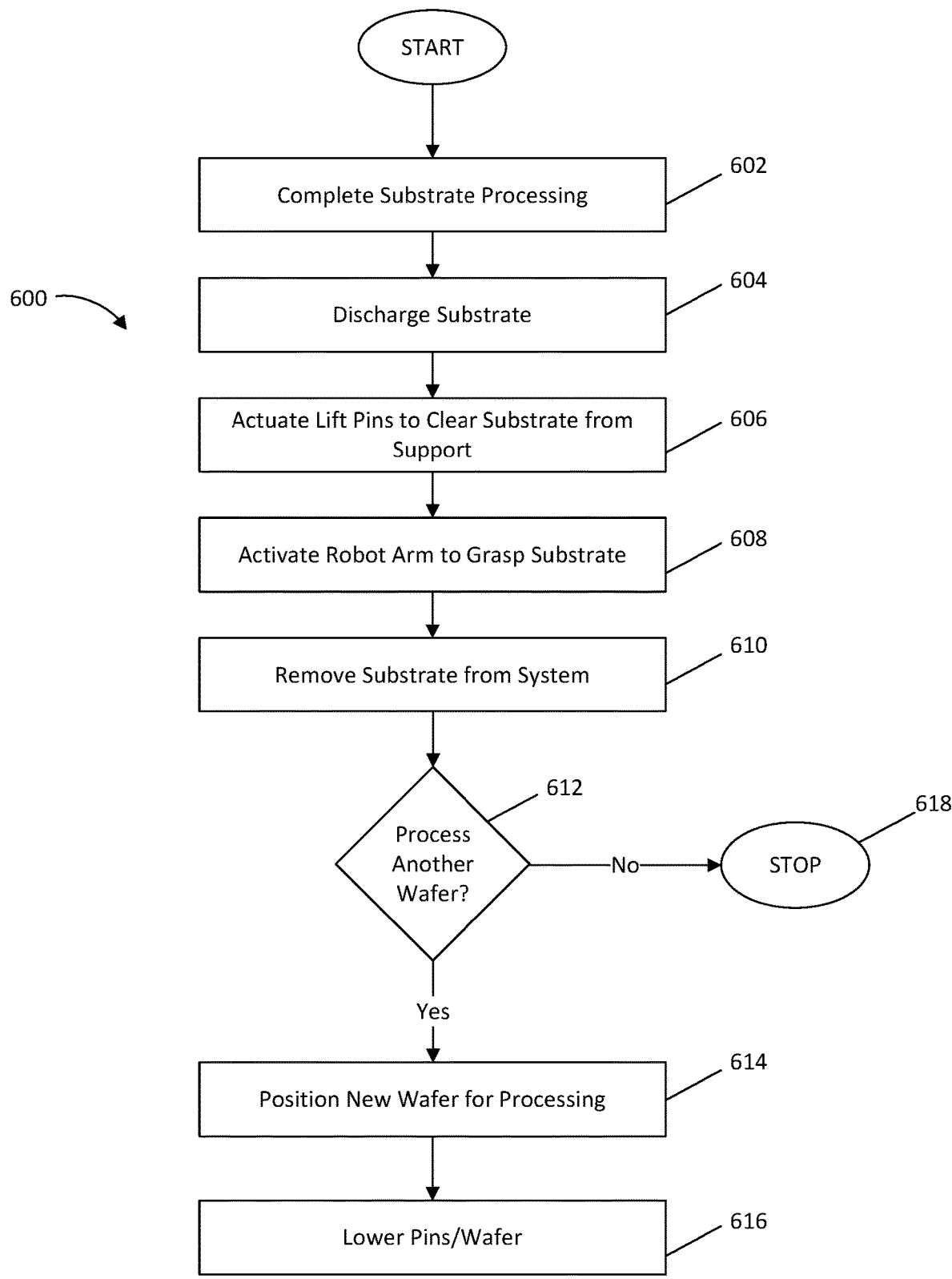
FIG. 6 illustrates a method for transferring a substrate between a support and a transfer chamber according to various embodiments.

Also disclosed herein are methods for controlling a lift apparatus, as described above, associated with a process chamber. FIG. 6 refers to a process 600 for transferring a substrate between a process chamber and a transfer plane associated with a transfer chamber. After completion of substrate processing at block 602, at block 604 the substrate is discharged from the semiconductor process chamber (e.g., discharged from a support). At block 606, the lift pins are actuated to clear the substrate from the support. As described above, a servo control system controls the lift apparatus and can determine the position of the substrate as well as the force output of the pneumatic cylinder(s). According to embodiments, the servo control system can control the speed of the lift pin(s) and can control how high and/or low to raise the lift pin(s). The servo control system can also control the force output of the cylinder, by independently controlling the pressure in each chamber of the pneumatic control valve, to avoid applying excessive force causing breakage of the substrate. At block 608, the robot arm is activated to grasp the substrate from the lift pin assembly. As discussed above, the robot arm can move just high enough to clear the lift pin assembly. At block 610, the robot arm removes the substrate from the process chamber system. Once the substrate is received, the robot arm may transfer the substrate into the transfer chamber. At block 612, if the system receives a signal to process another substrate by the semiconductor chamber, the robot arm positions the new substrate for processing on the lift pins at block 614. At block 616 the lift pins are lowered together with the substrate to place the substrate on the support.

Figure 7:
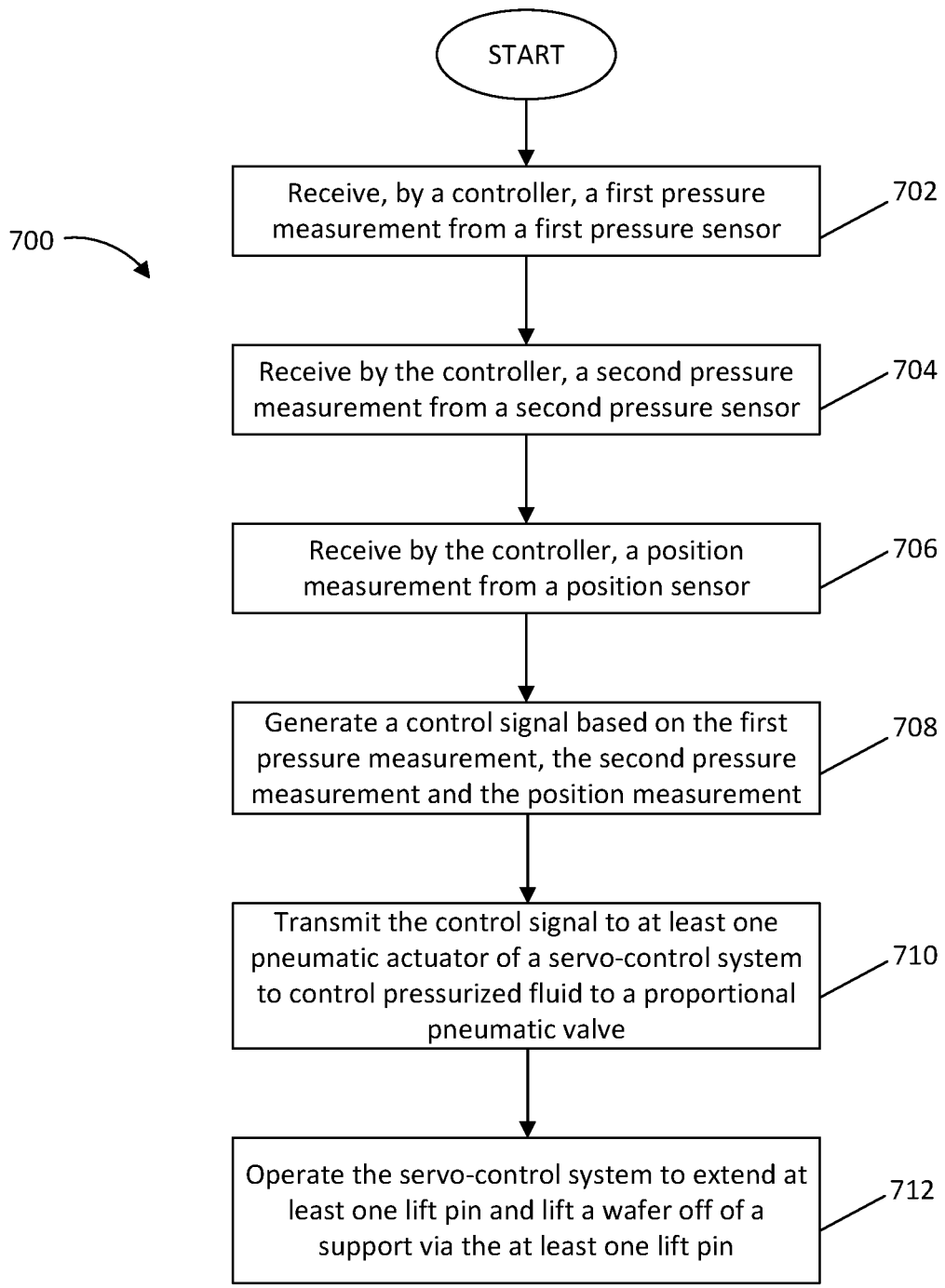
FIG. 7 illustrates a method of controlling a lift apparatus using a servo-control system according to various embodiments.

Referring to FIG. 7, according to embodiments, the method 700 can include at block 702 receiving, by a controller, a first pressure measurement from a first pressure sensor that measures pressure in a first chamber of a pneumatic actuator. The controller may be a computing device such as a programmable logic controller, system on a chip (SoC), and so on. The method can further include at block 704 receiving by the controller, a second pressure measurement from a second pressure sensor that measures pressure in a second chamber of the pneumatic actuator. At block 706, the method can include receiving by the controller a position measurement from a position sensor that measures a position of a moving member (e.g., cylinder) of the pneumatic actuator. At block 708, the method can include generating a control signal based on the first pressure measurement, the second pressure measurement, the position measurement, and the maximum acceptable contact force between the substrate and the lift mechanism. At block 710 the method can include transmitting the control signal to at least one proportional pneumatic valve of a servo-control system to control pressurized fluid to the pneumatic actuator. At block 712, the method can include operating the servo-control system to extend at least one lift pin and lift a substrate off of a support via the at least one lift pin. According to embodiments, the method may further include transferring the substrate from the at least one lift pin to a transfer plane and into a transfer chamber using a robot arm.

According to embodiments, the controller can determine the difference between the first pressure measurement and the second pressure measurement to determine an output force of the pneumatic proportional valve. In one embodiment, the controller adds the first pressure measurement to the second pressure measurement to determine a stiffness of the pneumatic proportional valve. The stiffness can be set to a high amount to make the control system more robust against the stiction in the lift mechanism. In response to the output force, the stiffness and the position of the moving member, the controller can control the at least one pneumatic actuator to move the lift mechanism up while preventing the breaking of the substrate.

Figure 8:
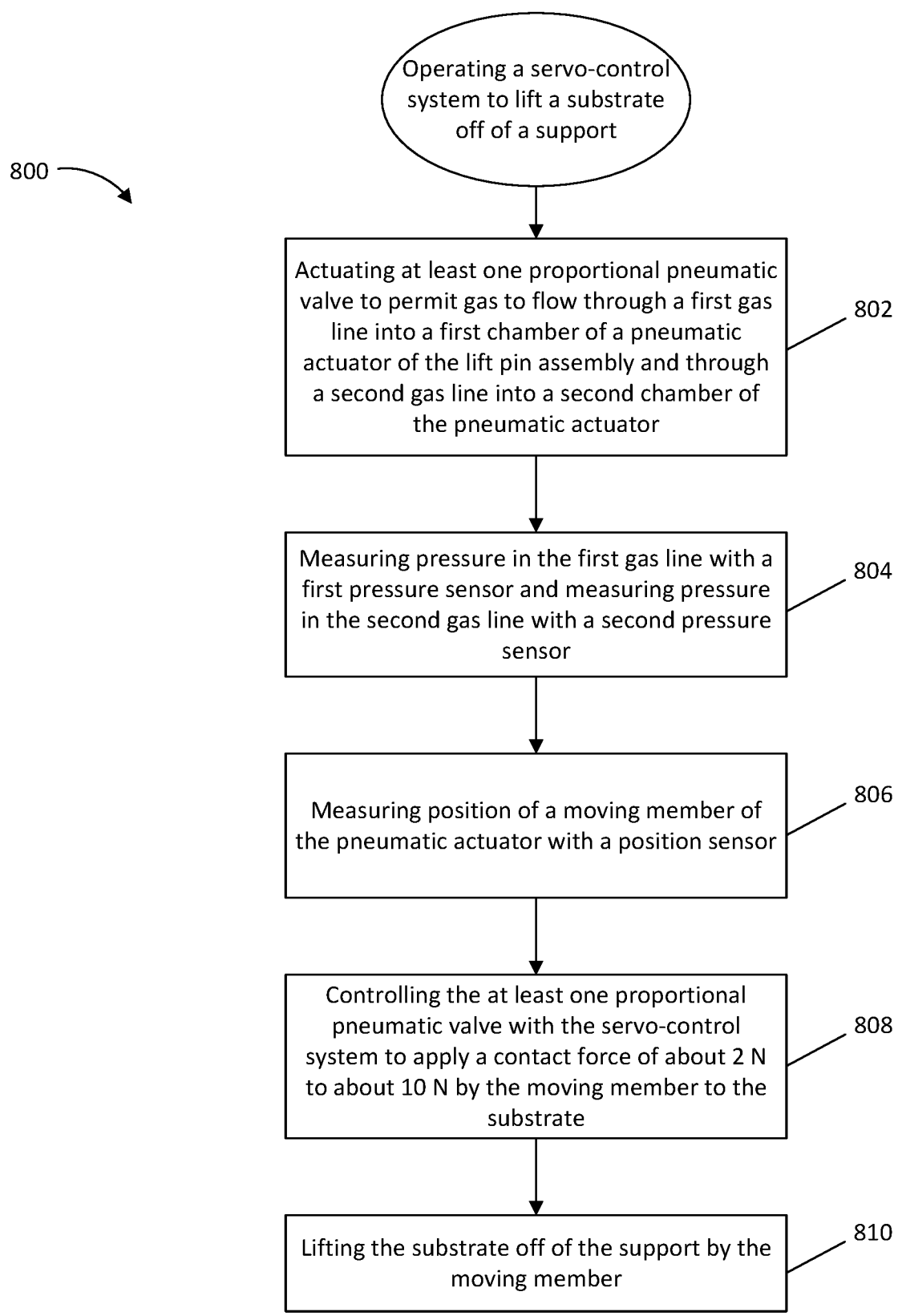
FIG. 8 illustrates a method of transferring a substrate from a process chamber to a transfer chamber using a robot arm in communication with a servo-controlled lift pin assembly according to various embodiments.

FIG. 8 illustrates a method 800 of operating a servo-control system to lift a substrate off of a substrate support. In accordance with embodiments described herein, the servo-control system is configured to control a lift pin assembly for lifting the substrate. The method 800 can include at block 802, actuating at least one proportional pneumatic valve to permit gas to flow through a first gas line into (or vent) a first chamber of a pneumatic actuator of the lift pin assembly and through a second gas line into (or vent) a second chamber of the pneumatic actuator. As discussed herein, in embodiments the lift pin assembly can include, for example, two proportional pneumatic valves. A first of the valves can control pressure in the first gas line and a second of the valves can control pressure in the second gas line and both valves may be controlled by the servo-control system. The at least one proportional pneumatic valve may also include a vent to release pressure in the gas supply lines as may be needed to balance pressure between the first chamber and the second chamber and to achieve a desired force output or contact force of the at least one lift pin against the substrate.

The method 800 may further include at block 804, measuring pressure in the first gas line with a first pressure sensor and measuring pressure in the second gas line with a second pressure sensor. Each pressure sensor may be located at any point in the line between the at least one proportional pneumatic valve and the pneumatic actuator. In embodiments, each pressure sensor may be positioned and operable to measure the pressure at the inlet of each chamber of the pneumatic actuator.

The method 800 may further include at block 806 measuring the position of the moving member (e.g., the piston connected to the lift pin) of the pneumatic actuator with a position sensor. As shown in FIGS. 3 and 4, when the moving member is positioned at approximately the middle of the pneumatic actuator the position is x=0. If the moving member moves away from the substrate (e.g., downward), then the moving member moves in a negative direction (−x). If the moving member moves toward the substrate (e.g., upward), then the moving member moves in a positive direction (+x).

The method 800 further can include a block 808, controlling the at least one pneumatic actuator with the servo-control system to apply a contact force of about 2 N to about 10 N by the moving member to the substrate. When the moving member, which comprises the lift pin, contacts the substrate to lift the substrate off of the support, the force applied by the moving member to the substrate is controlled to about 2 N to about 10 N to avoid breaking or cracking the substrate. The servo-control system will actuate the at least one proportional pneumatic valve to increase, decrease or maintain the pressure supplied to (or in) each of the chambers of the pneumatic actuator. According to embodiments, the pressure supplied to each chamber may be independently controlled by a plurality of proportional pneumatic valves. For example, the pressure $p_A$ in the first chamber may be increased, while the pressure $p_B$ in the second chamber is decreased (e.g., vented). If the servo-control system determines that moving the moving member will cause the contact force on the substrate to exceed about 2 N to about 10 N, for example, about 2 N, about 3 N, about 4 N, about 5 N, about 6 N, about 7 N, about 8 N, about 9 N, or about 10 N, then the servo-control system will determine that the wafer is sticking and will actuate the at least one proportional pneumatic valve to maintain the pressure in each of the chambers. This applies a constant force to the substrate that will, for example, peel the substrate off of the support, but without cracking or breaking the substrate.

The method 800 further includes at block 810 lifting the substrate off of the support by the moving member. As discussed above, the moving member will move and apply a contact force of about 2 N to about 10 N to the substrate. The moving member may move in a negative direction, may stop moving or may move in a positive direction to maintain the contact force on the substrate. Once the moving member moves to a position of about 1 mm to about 7 mm in a positive (+x) direction from the middle position (x=0) of the moving member, then the servo-control system may accelerate movement of the moving member with the wafer thereon. For example, when the position of the moving member is at about 1 mm to about 7 mm, or about 2 mm in a positive direction from a center position of the moving member, the servo-control system sends a signal to the proportional pneumatic valve to increase pressure in at least one of the first chamber or the second chamber to accelerate the moving member in the positive direction. According to embodiments, the method can include accelerating the moving member to a speed of about 10 mm/s to about 150 mm/s, or about 15 mm/s to about 125 mm/s, or about 20 mm/s to about 100 mm/s, or about 25 mm/s to about 75 mm/s, or about 30 mm/s to about 50 mm/s, or about 30 mm/s to about 35 mm/s, or about 30 mm/s, or about 35 mm/s, or about 100 mm/s. It should be noted that although the drawings in FIGS. 3 and 4 are shown in a horizontal arrangement, lift pin assemblies are typically in a vertical orientation.

According to various embodiments, during processing of the substrate in the chamber, the at least one lift pin is lowered to a hard stop position (y=0). Upon completion of processing, the at least one lift pin is moved upward at a velocity of about 1 mm/s to about 3 mm/s, or about 2 mm/s to contact the substrate at a substrate release plane (e.g., y=20 mm). As described above, the contact force of the at least one lift pin on the substrate is controlled to about 2 N to about 10 N. Once the moving member in the pneumatic actuator and the at least one lift pin with the substrate thereon move about 2 mm to about 7 mm in a positive direction from a middle position in the pneumatic actuator, then the servo-control system determines that the substrate is clear of the support.

The servo-control system may then accelerate the moving member to a velocity of about 10 mm/s to about 150 mm/s, or about 15 mm/s to about 125 mm/s, or about 20 mm/s to about 100 mm/s, or about 25 mm/s to about 75 mm/s, or about 30 mm/s to about 50 mm/s, or about 30 mm/s to about 35 mm/s, or about 30 mm/s, or about 35 mm/s, or about 100 mm/s. When the substrate is at or near a substrate exchange plane (e.g., y=25 mm), then the servo-control system may slow the speed of the at least one lift pin and substrate to about 1 mm/s to about 25 mm/s, or about 5 mm/s to about 20 mm/s, or about 10 mm/s to about 15 mm/s to softly contact an end effector of a robot arm with the substrate positioned at a wafer exchange plane (e.g., y=25 mm). Once the substrate is securely positioned on the end effector, the robot arm with the substrate received thereon may move at a velocity of about 35 mm/s to about 50 mm/s to a substrate lift plane (e.g., y=30 mm) and transfer the substrate to the transfer chamber. In embodiments, at about 15 mm to about 50 mm, or about 35 mm above the lowered hard stop, there is an upper hard stop.

According to embodiments, the above described methodology can be reversed. In particular, the robot arm and end effector with a new substrate received thereon may be moved from the wafer lift plane to the substrate exchange plane at a rate of about 35 mm/s to about 50 mm/s. At the wafer exchange plane, the substrate is received by the at least one lift pin which is then lowered at a velocity of about 1 mm/s to about 25 mm/s, or about 5 mm/s to about 20 mm/s, or about 10 mm/s to about 15 mm/s. Once the substrate and at least one lift pin clear the end effector, the at least one lift pin is lowered at a velocity of about 10 mm/s to about 150 mm/s, or about 15 mm/s to about 125 mm/s, or about 20 mm/s to about 100 mm/s, or about 25 mm/s to about 75 mm/s, or about 30 mm/s to about 50 mm/s, or about 30 mm/s to about 35 mm/s, or about 30 mm/s, or about 35 mm/s, or about 100 mm/s. When the substrate reaches the support, the velocity is slowed to about 1 mm/s to about 3 mm/s, or about 2 mm/s to softly place the substrate on the support.

The above described apparatus, systems and methods shorten the range of motion of the at least one lift pin when lifting and lowering a substrate.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method, comprising:
   receiving by a controller a first pressure measurement from a first pressure sensor that measures pressure in a first chamber of a pneumatic actuator;
   receiving by the controller a second pressure measurement from a second pressure sensor that measures pressure in a second chamber of the pneumatic actuator;
   receiving by the controller a position measurement from a position sensor that measures a position of a moving member of the pneumatic actuator;
   determining by the controller an output force based on a commanded force and an estimated force, wherein the commanded force is based at least in part on the position measurement, and wherein the estimated force is based on the first pressure measurement, the second pressure measurement, and the position measurement;
   generating a control signal based on the output force;
   transmitting the control signal to at least one proportional pneumatic valve of a servo-control system to control pressurized fluid to the pneumatic actuator; and
   operating the servo-control system using the control signal.

2. The method of claim 1, wherein the servo-control system is operated to extend at least one lift pin and lift a substrate off of a support via the at least one lift pin, the method further comprising transferring the substrate from the at least one lift pin to a transfer chamber using a robot arm.

3. The method of claim 1, wherein the controller determines a difference between the first pressure measurement and the second pressure measurement to determine the output force of the pneumatic actuator, and wherein the controller adds the first pressure measurement to the second pressure measurement to determine a stiffness of the pneumatic actuator.

4. The method of claim 3, wherein in response to the output force, the stiffness and the position of the moving member, the controller controls the at least one proportional pneumatic valve by determining a pressure for each of two chambers of the pneumatic actuator.

5. The method of claim 1, further comprising:
   operating the servo-control system to extend at least one lift pin and lift a substrate off of a support via the at least one lift pin.

6. A method comprising:
   operating a servo-control system, comprising:
      actuating at least one proportional pneumatic valve to permit gas to flow through a first gas line into a first chamber of a pneumatic actuator and through a second gas line into a second chamber of the pneumatic actuator;
      measuring pressure in the first gas line with a first pressure sensor and measuring pressure in the second gas line with a second pressure sensor;
      measuring position of a moving member of the pneumatic actuator with a position sensor;
      determining an output force based on a commanded force and an estimated force, wherein the commanded force is based at least in part on the position of the moving member, and wherein the estimated force is based on the pressure in the first gas line, the pressure in the second gas line, and the position of the moving member; and
      controlling the at least one proportional pneumatic valve with the servo-control system to apply a contact force of about 2 N to about 10 N by the moving member based on the output force.

7. The method of claim 6, wherein the servo-control system is performed to lift a substrate off of a substrate support, wherein the servo-control system is configured to control a lift pin assembly for lifting the substrate, the method further comprising:
   lifting the substrate off of the support by a lift pin operable to receive a load by the moving member,
   wherein the lift pin assembly comprises:
      the lift pin;
      the pneumatic actuator comprising the moving member;
      the at least one proportional pneumatic valve;
      the first pressure sensor;
      the second pressure sensor; and
      the position sensor.

8. The method of claim 6, wherein a controller of the servo-control system is connected to the pneumatic actuator, the at least one proportional pneumatic valve, the first pressure sensor and the second pressure sensor, and the position sensor.

9. The method of claim 6, wherein controlling the at least one proportional pneumatic valve comprises maintaining, reducing or reversing gas flow to at least one of the first chamber or the second chamber.

10. The method of claim 6, wherein controlling the at least one proportional pneumatic valve comprises maintaining pressure to the first chamber and the second chamber at a constant value to apply a constant contact force by the moving member.

11. The method of claim 6, wherein when the position of the moving member is at about 1 mm to about 7 mm, or about 2 mm in a positive direction from a center position of the moving member, the servo-control system sends a signal to the proportional pneumatic valve to increase pressure in at least one of the first chamber or the second chamber to accelerate the moving member in the positive direction.

12. The method of claim 11, wherein the moving member is accelerated to a speed of about 50 mm/s to about 150 mm/s, or about 75 mm/s to about 125 mm/s, or about 100 mm/s.

13. The method of claim 6, wherein the servo-control system is configured to control a lift pin assembly for lifting a substrate.

14. A method, comprising:
   receiving by a controller a first pressure measurement from a first pressure sensor that measures pressure in a first chamber of a pneumatic actuator;
   receiving by the controller a second pressure measurement from a second pressure sensor that measures pressure in a second chamber of the pneumatic actuator;
   receiving by the controller a position measurement from a position sensor that measures a position of a moving member of the pneumatic actuator;
   determining by the controller an output force of the pneumatic actuator based on a difference between the first pressure measurement and the second pressure measurement;

determining by the controller a stiffness of the pneumatic actuator based on adding the first pressure measurement to the second pressure measurement;
generating a control signal based on the first pressure measurement, the second pressure measurement and the position measurement;
transmitting the control signal to at least one proportional pneumatic valve of a servo-control system to control pressurized fluid to the pneumatic actuator; and
operating the servo-control system using the control signal.

* * * * *